US008315410B2

(12) United States Patent
Magrath (10) Patent No.: US 8,315,410 B2
(45) Date of Patent: Nov. 20, 2012

(54) DYNAMIC RANGE CONTROLLER (75) Inventor: Anthony James Magrath, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 856 days.

(21) Appl. No.: 12/338,348

(22) Filed: Dec. 18, 2008

(65) Prior Publication Data
US 2009/0161889 A1 Jun. 25, 2009

(30) Foreign Application Priority Data

Dec. 19, 2007 (GB) .................................. 0724741.4

(51) Int. Cl.
*H03G 3/00* (2006.01)
(52) U.S. Cl. ........ 381/107; 381/104; 381/105; 381/106; 330/375; 330/345
(58) Field of Classification Search .......... 381/104–107; 330/279; 375/345
See application file for complete search history.

(56) References Cited

U.S. PATENT DOCUMENTS

| 7,058,188 | B1 | 6/2006 | Allred |
| 2002/0021172 | A1 | 2/2002 | Imai |
| 2002/0172374 | A1* | 11/2002 | Bizjak ........................ 381/71.14 |
| 2006/0034400 | A1* | 2/2006 | Yang et al. .................... 375/345 |

FOREIGN PATENT DOCUMENTS

| GB | 2 179 810 A | 3/1987 |
| GB | 2 342 023 A | 3/2000 |
| WO | WO 03/063346 A2 | 7/2003 |

OTHER PUBLICATIONS

McNally, "Dynamic Range Control of Digital Audio Signals" J. Audio Eng. Soc., vol. 32, No. 5, pp. 316-327, May 1984.

* cited by examiner

*Primary Examiner* — Evan Pert
*Assistant Examiner* — Mark A Laurenzi
(74) *Attorney, Agent, or Firm* — Dickstein Shapiro LLP (57) ABSTRACT

A circuit for preventing clipping in an Automatic Level Control (ALC) or Limiter, where the amplitude of the signal above the clipping point is estimated, then the signal level is automatically reduced over a defined period substantially equal to the feedforward delay in the ALC/Limiter. By adaptively controlling, based on the excess amplitude and the delay time available, an attack rate used in the ALC/Limiter to reduce the gain applied to an input signal, it can be ensured that the output amplitude is brought within the clipping level sufficiently quickly to prevent audible clipping.

13 Claims, 7 Drawing Sheets

DYNAMIC RANGE CONTROLLER

FIELD OF THE INVENTION

The present invention relates to a dynamic range controller such as an Automatic Level Controller (ALC) and/or Limiter. More particularly, but not necessarily exclusively, the present invention concerns an anti-clip circuit or function added to a dynamic range controller, such as one used for processing digital audio signals.

BACKGROUND OF THE INVENTION

Automatic Level Controllers (ALCs) and Limiters are used for controlling the dynamic range of a signal, usually, but not always, an audio signal. Typically, low level audio signals are boosted to improve audibility, and high-level signals are attenuated to prevent clipping i.e. distortion. ALCs/Limiters are often used in portable equipment with microphones so that sound sources which are a long way from the microphone are boosted to the same level as sound sources close to the microphone. In the rest of this specification, the term "dynamic range control" will be used to cover both ALC and Limiter functions.

Figure 1A:
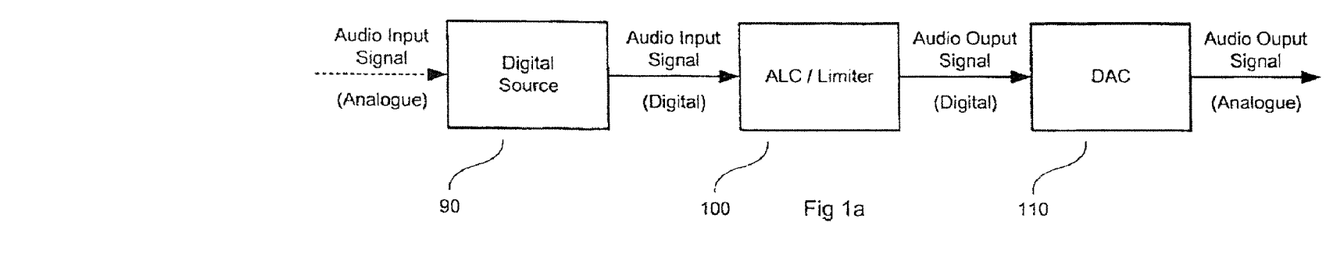
FIG. 1a is a schematic block diagram of an audio system employing a dynamic range controller.
Figure 1B:
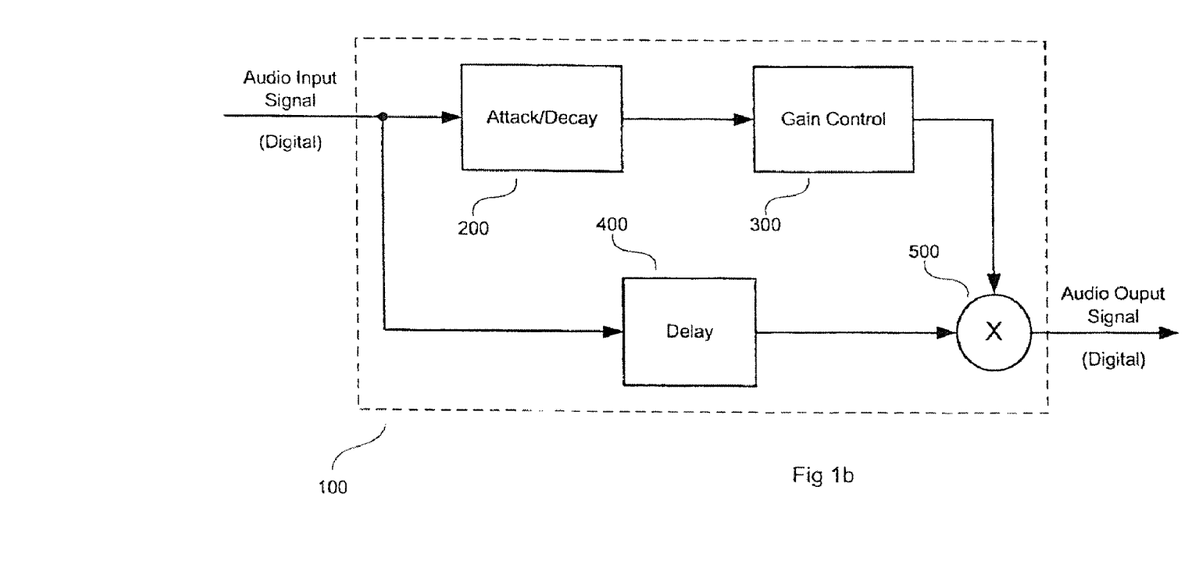
FIG. 1b is a schematic block diagram of a known dynamic range controller architecture.

Conventionally, dynamic range control was carried out using analogue circuitry but recently, digital implementations have grown in popularity. An audio system employing an ALC/Limiter is shown schematically in FIG. 1a, and a commonly used architecture for an ALC or Limiter in digital form is shown in FIG. 1b. In the system of FIG. 1a, the input audio signal is obtained as a series of sample words, for example of 16 or 24 bits, derived from a digital source 90 such as a CD player, digital microphone or analogue-to-digital converter (ADC). The ALC/Limiter 100 performs dynamic range control of the digital audio input signal, and may be followed by a digital-to-analogue converter (DAC) 110 to convert the signal back to analogue.

As depicted in FIG. 1b, the ALC/Limiter 100 has an Attack/Decay block 200, acting as a signal detector for determining the average or peak amplitude of the signal, followed by a Gain Control block 300. The Attack/Decay block 200, as the name suggests, controls the attack and decay times for the circuit, which controls the dynamics of the audio output signal. The input audio signal, as well as being supplied to the Attack/Decay 200 block, is also fed through a delay element 400 and the delayed signal is modified by the output of the gain control block 300 at a multiply stage 500, before being converted to an analogue signal by the Digital-to-Analogue Converter 110 of FIG. 1a, if necessary.

Figure 2:
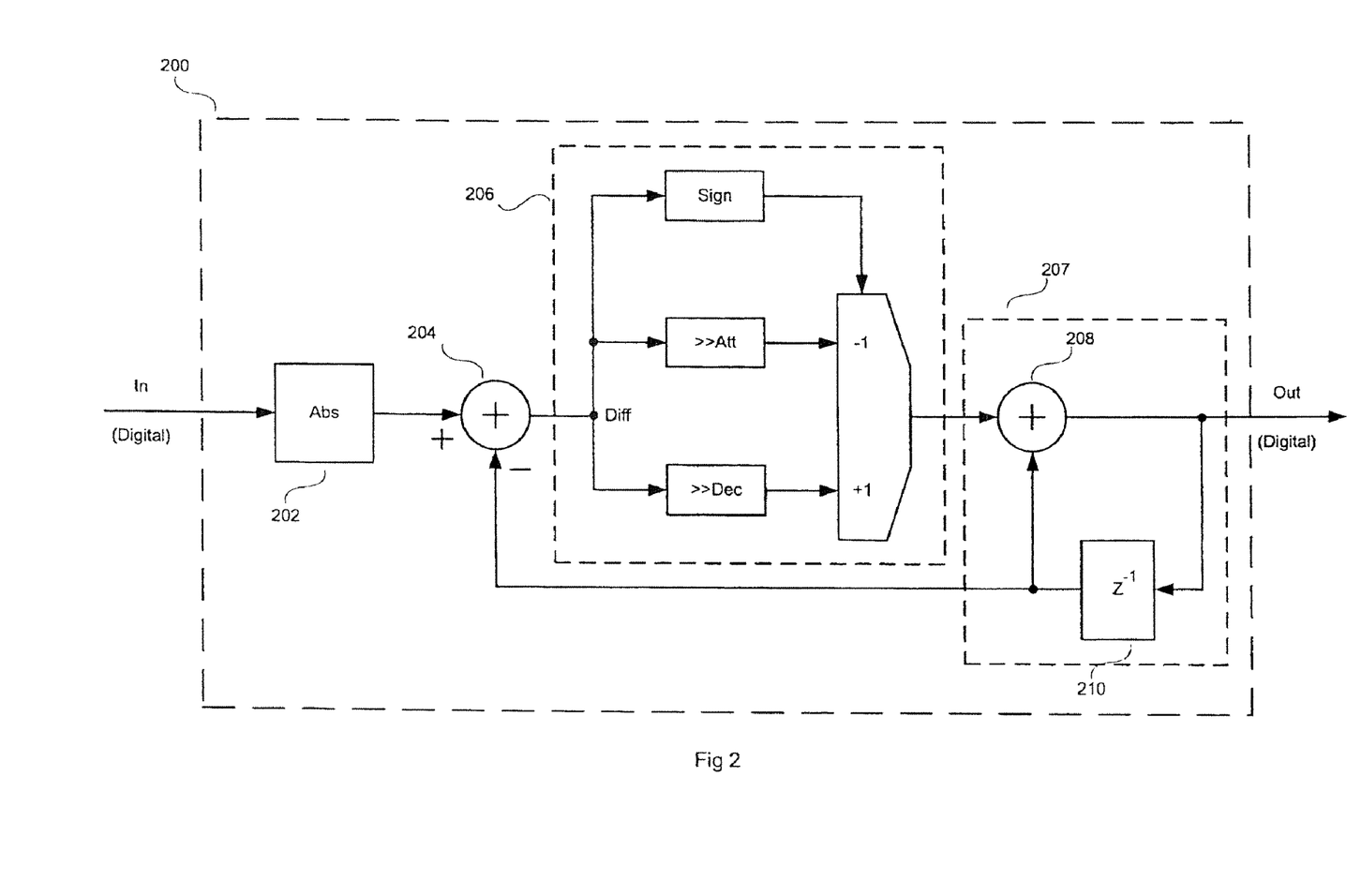
FIG. 2 schematically shows one possible arrangement of an Attack/Decay block of the architecture of FIG. 1.

An implementation of the Attack/Decay block 200 is shown in FIG. 2, which is similar to that described in the following background reference [1]:

G. W. McNally, "Dynamic Range Control of Digital Audio Signals", Journal Audio Engineering Society, Vol 32, No 5 May 1984.

The absolute magnitude (Abs) of the input audio signal In is first determined in block 202. The difference Diff between the output of the Abs block 202 and the output of an integrator 207 (formed by an output-side adder 208 and a delay element 210, the delay element 210 being denoted in FIG. 2 by $z^{-1}$) is determined by feeding the output of the integrator 207 as a negative quantity to an input-side adder 204. The Attack/Decay block 200 is operable either in an attack mode or in decay mode, as determined by a bit shifter 206.

If the difference signal Diff is positive, this means that the input signal In is greater than the current output signal Out, therefore the Attack/Decay block 200 must enter the attack mode. In the attack mode, the difference signal Diff from adder 204 is multiplied by the attack coefficient Aft (shown in FIG. 2 as a simple shifter, for hardware simplicity), then added to the integrator 207. This causes the output level Out to increase at a rate determined by the attack coefficient Att. If the difference signal Diff is negative, the Attack/Decay block 200 enters the decay mode and the difference signal Diff is multiplied by the decay coefficient Dec. This causes the level of the output signal Out to decrease at the decay rate. Since the value added to the integrator 207 becomes smaller if the difference signal (Diff) is smaller, the value of the output signal Out converges to that of the input signal In with an exponential characteristic. The output signal Out is supplied to the Gain Control block 300 of FIG. 1b.

Typical attack and decay times would be 2 ms/6 dB gain change and 1 s/6 dB gain change, respectively. Attack times are much faster than decay times to allow the ALC/Limiter to react quickly to sudden increases in the input signal level.

Figure 3:
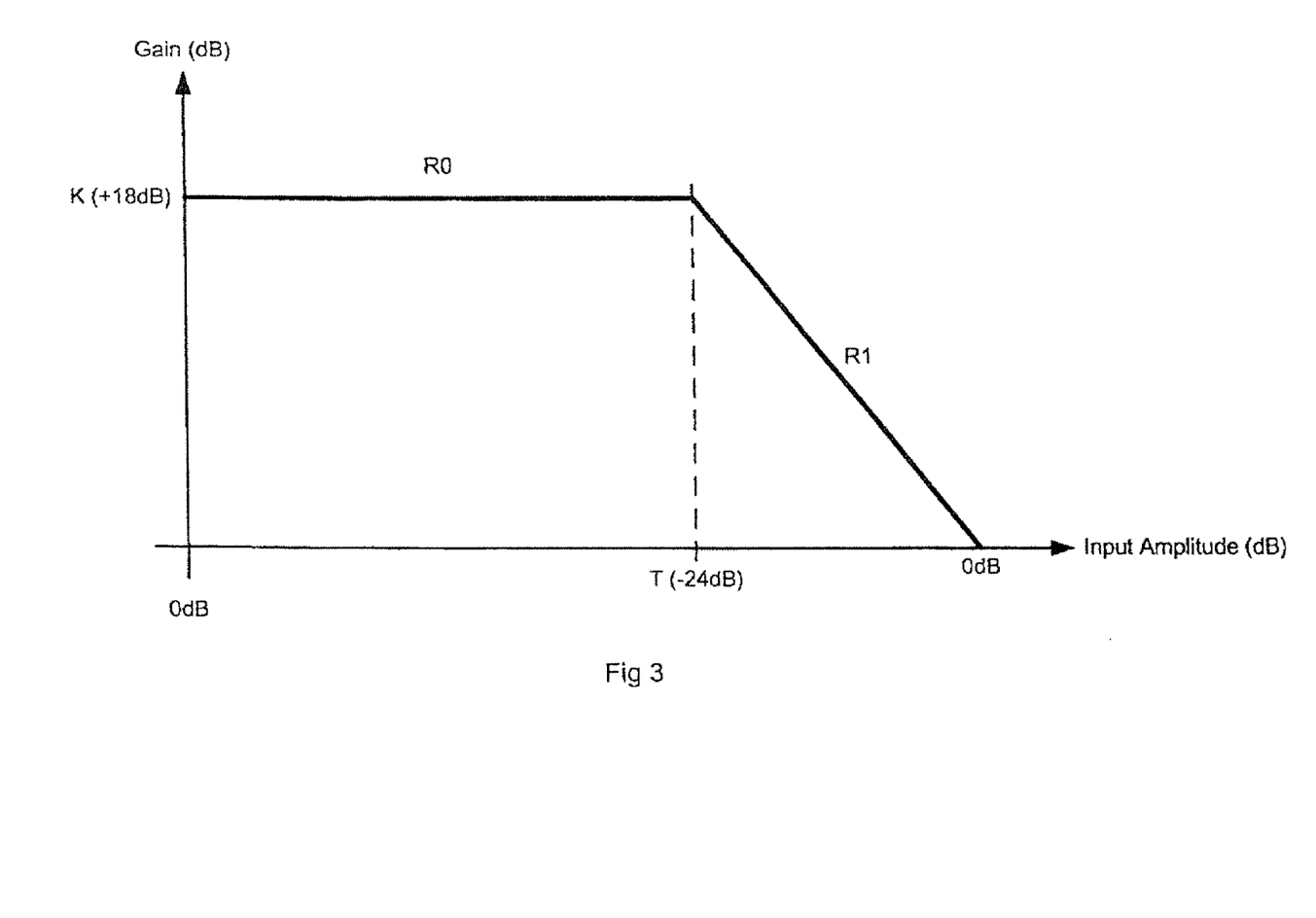
FIG. 3 illustrates the gain characteristic of a Gain Control block of the architecture of FIG. 1.

In FIG. 1b, the Gain Control block 300 uses lookup tables or equations to determine the correct gain to apply to the input signal. For example, in a Limiter application, a fixed gain K may be applied (with zero slope, R0) up to a certain input threshold value T, beyond which the gain is gradually reduced (with a negative slope, R1) to prevent clipping, as shown in FIG. 3.

Figure 4:
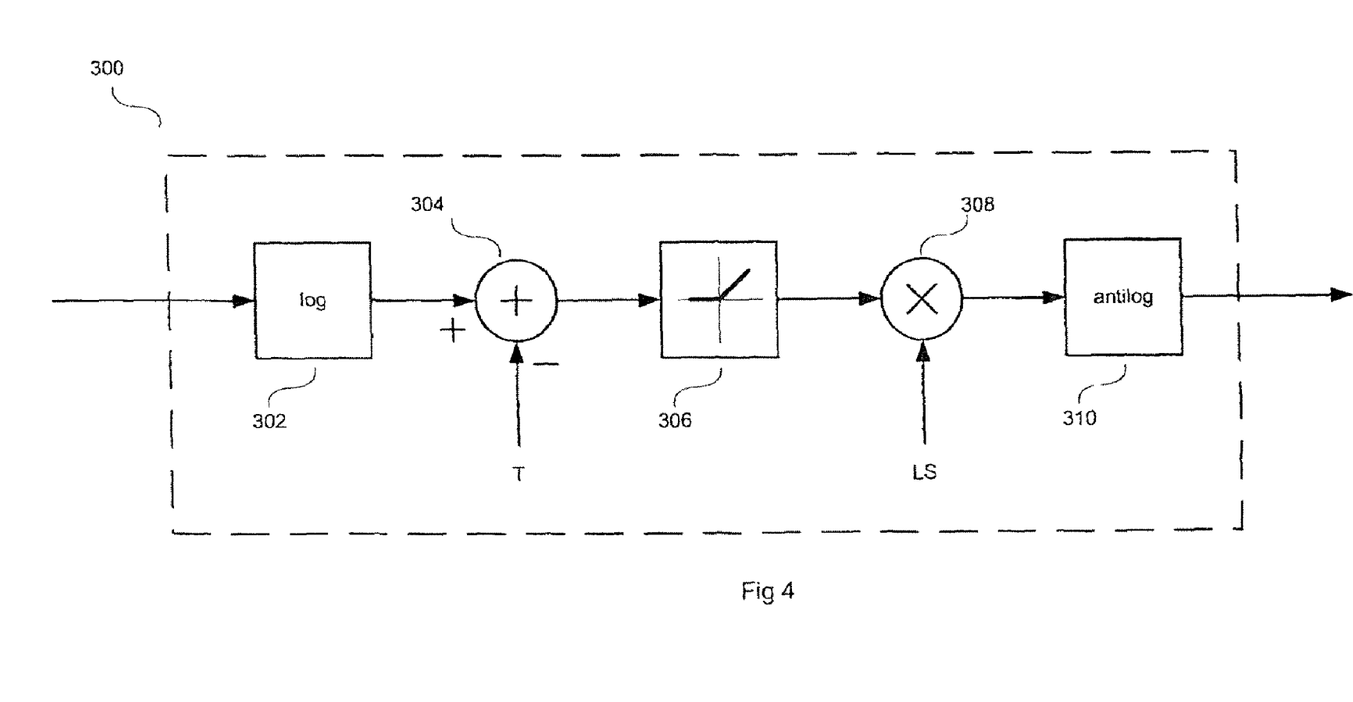
FIG. 4 schematically illustrates a basic configuration of this Gain Control block.

An example of the basic configuration of the Gain Control block 300 is shown in FIG. 4. In FIG. 4, an input signal from the Attack/Decay block 200 is converted into the log-domain at 302 and a threshold value T is subtracted from the input signal in adder 304. The resulting signal is passed into a non-linear block 306 which applies unity gain for inputs above zero and a gain of zero for signals below zero. This means that an input signal at the threshold T or below (−24 dB) becomes a zero log-domain value, and an input signal above the threshold T is converted to a signal proportional to its amplitude above the threshold T. The signal output from the non-linear block 306 is multiplied by the gain LS in multiplier 308. The effect is, for an initial input signal below the threshold T (i.e. below −24 dB), to apply 0 dB gain, and for signals above the threshold T, to apply an attenuation proportional to the signal level relative to the threshold T. Finally, the signal output from the multiplier 308 is passed through an antilog converter 310 to yield the gain which is applied to the delayed audio input in multiplier block 500 (refer back to FIG. 1b).

The precise implementation of the gain control will depend on the functions such as ALC or compression to be performed.

A problem can occur if a low level signal is applied, followed by a high level signal. The following example relates to the gain curve of FIG. 3, for an attack rate of 2 ms/6 dB. When an input signal level of −30 dB is applied (i.e. below the threshold level T), a fixed gain of +18 dB is applied. If a 0 dB input signal is then applied, the gain will remain at 18 dB initially, but will then reduce at the attack rate of 2 ms/6 dB. Assuming that the maximum signal level at the output of the system is 0 dB, the signal will clip for 6 ms, i.e. until the gain is reduced to 0 dB. For an audio signal, this clipping will cause audible distortion. Moreover, such a large signal amplitude will consume a considerable amount of power, which in itself can be problematic in battery-powered apparatus such as a portable audio player or mobile telephone.

A known solution to the above problem is to provide a delay before applying the gain control, as in the architecture shown in FIG. 1b (see delay 400) which helps the ALC/Limiter adjust the gain signals before the clipping occurs. In other words, the input signal is held for a short time allowing the gain to start to reduce before this signal reaches the multiplier (500 in FIG. 1b). Unfortunately, to prevent clipping completely, in this example a delay of 6 ms is required. For a typical audio sample-rate of 44.1 kHz, this corresponds to 265 delays, i.e. the storage for 265 samples typically in 16-bit words, which would require significant memory and would thus, in an integrated circuit, require relatively significant silicon real-estate. Additionally, such a long delay is undesirable in many applications such as real-time processing.

Accordingly, it would be desirable to provide a dynamic range controller which prevents or minimises clipping without these drawbacks.

SUMMARY OF THE INVENTION

According to a first aspect of the present invention, there is provided a dynamic range controller for converting a varying input signal to an output signal with a controlled dynamic range, comprising: a gain setting block arranged to receive the input signal and to set a gain value to be applied to the input signal in converting it to said output signal; a delay block arranged to delay the input signal by a predetermined time T prior to applying said gain value; and an anti-clip control block arranged to provide a control signal to the gain setting block based on a level of the input signal such that an attack rate, with which said gain value is reduced, is adaptively controlled to decrease the level of said output signal to at most a maximum permitted signal level within the time T.

Preferably, the anti-clip control block is arranged to receive an estimate of the level of the output signal which would be obtained by applying, to the current level of the input signal, the gain value presently set in the gain setting block.

In an embodiment of the present invention the gain setting block comprises: a gain control block arranged to receive the input signal and to generate a gain setting value; and an attack/decay block arranged to apply said attack rate or a decay rate as a rate of change to the gain setting value from the gain control block in order to determine said gain value to be applied to the input signal, and responsive to the control signal from the anti-clip control block to vary said attack rate.

In this embodiment preferably the gain control block is arranged to find and output the absolute value of the varying input signal.

The dynamic range controller may further comprise an adder arranged to receive said absolute value and the gain value set by the attack/decay block, the output of which provides said estimate of the level of the output signal to the anti-clip control block.

Preferably, the anti-clip control block further comprises a latch arranged to store said estimate when this exceeds the maximum permitted signal level, and a divider for dividing the stored value by a quantity corresponding to the predetermined time T to provide said attack rate as said control signal to the gain setting block.

The maximum permitted signal level may be a clipping level, the anti-clip control block providing said control signal based on an amount by which the clipping level is predicted to be exceeded based on a present level of the input signal and the gain value presently set.

The input signal may be a digital signal comprising a series of samples, the delay element providing temporary storage of N said samples, and in this case said control signal is indicative of a value d/N where d is said amount by which the clipping level is predicted to be exceeded.

Such an input signal may be in the log domain, the attack rate linearly reducing the level of the input signal over the time T to within the maximum permitted level.

Alternatively, the input signal is converted to the log domain prior to processing by the gain setting block and the anti-clip control block.

Antilog conversion means may be provided for converting the gain value out of the log domain prior to it being applied to the delayed input signal.

In embodiments of the present invention the anti-clip control block is arranged to provide a first said control signal indicative of said attack rate and a second control signal instructing the gain setting block to apply said attack rate to reduce the gain value.

Further, the gain setting block may be arranged to detect an average or peak level of the input signal. For example, the gain setting block applies the average or peak level as an index to a look-up table of gain values.

A multiplier may be provided for multiplying the delayed input signal by the gain value set by the gain setting block.

According to a second aspect of the present invention, there is provided a method of restricting the dynamic range of a varying input signal, comprising:

detecting the instantaneous signal level of the input signal;
setting a level of gain to be applied to the input signal; and
applying gain to the input signal according to the level of gain set in said setting step to obtain an output signal having a restricted dynamic range; wherein said setting step involves adaptively controlling an attack rate with which to decrease the level of gain, said attack rate being derived from said instantaneous signal level and the level of gain presently set by the gain control means.

Embodiments of the above dynamic range controller and method can be used to provide a compressor function, an automatic level control function, and/or a limiter function, typically of an audio signal.

Further aspects of the present invention provide an audio apparatus including the dynamic range controller as defined above, and a computer-readable medium carrying software for implementing the above method when run by a processor of a digital audio apparatus.

The audio apparatus may include any of a microphone, an internal memory, or a medium-based storage device, from which said input signal is derived. The audio apparatus may be in the form of a mobile telephone.

By means of the present invention, an attack rate used in a dynamic range controller to reduce a gain applied to a signal can be adaptively controlled, based on an amplitude in excess of a clipping level which would otherwise be expected, and the delay time available. Therefore, it can be ensured that the output amplitude is brought within the clipping level sufficiently quickly to prevent audible clipping of an audio signal, and/or to avoid excessive power consumption of downstream circuitry.

BRIEF DESCRIPTION OF THE DRAWINGS

Reference is made, by way of example only, to the accompanying drawings in which.

DETAILED DESCRIPTION

Figure 5:
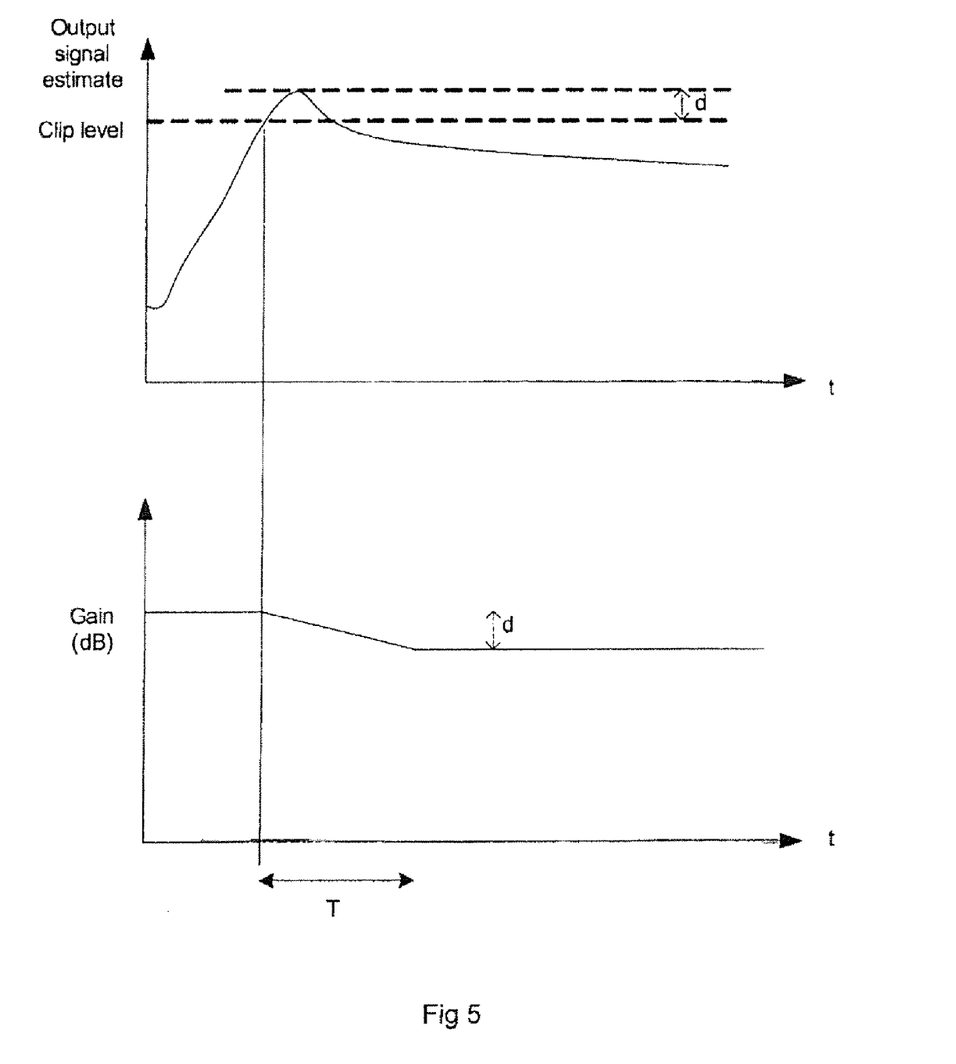
FIG. 5 illustrates the principle of the present invention.

An embodiment of the present invention will now be described with reference to the drawings. Before describing the constituent parts of the embodiment in detail, the underlying principle will first be explained by referring to FIG. 5.

The invention prevents or reduces clipping in a system comprising a dynamic range controller without the need for a large delay, by adaptively adjusting the attack rate according to the signal size and delay T in the system. The dynamic range controller (ALC/Limiter) first finds an estimate of the output level which is predicted to occur with the current gain applied. In the example shown by the upper graph in FIG. 5, the gain is high enough to cause clipping when the signal level rises above the lower dashed line marked "Clip level". The signal level reaches a maximum of 'd' dB above the clip level. To prevent clipping, the gain must be attenuated by d dB in time T (see the lower graph in FIG. 5). If the delay is N samples, the Anti-clip control attenuates the gain by d/N dB every sample, so that over N samples, the gain is gradually reduced to prevent clipping. Because the value d/N is dependent on signal size, the circuit is adaptively controlling the attack rate to minimise clipping. This differs from known dynamic range controllers which have a fixed attack rate.

Since the Anti-clip circuit adaptively adjusts the attack rate, it is convenient to reorder the blocks so that the Attack/Decay block is implemented after the Gain control block. Thus, in the embodiment to be described, the Attack/Decay block is used to process a variable representing the required gain, rather than the input signal itself as in the prior art architecture of FIG. 1b. In this way, the attack and decay times from the Attack/Decay block are used to control the rate of change of the gain. It is also convenient to implement the entire control path in the logarithmic domain, as this makes the arithmetic simpler. The simplest implementation uses base-2-log and antilogarithmic calculations using the implementations discussed in [1]. The block diagram of the overall circuit in one embodiment of the present invention is shown in FIG. 6.

Figure 6:
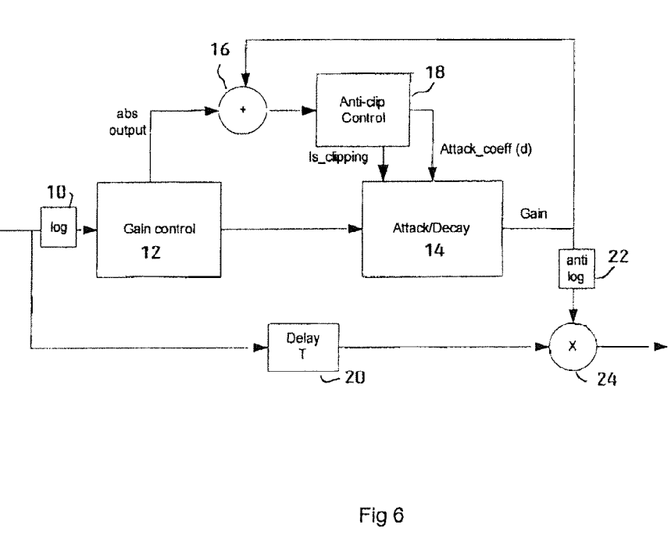
FIG. 6 is a schematic block diagram of a dynamic range controller embodying the present invention.
Figure 7:
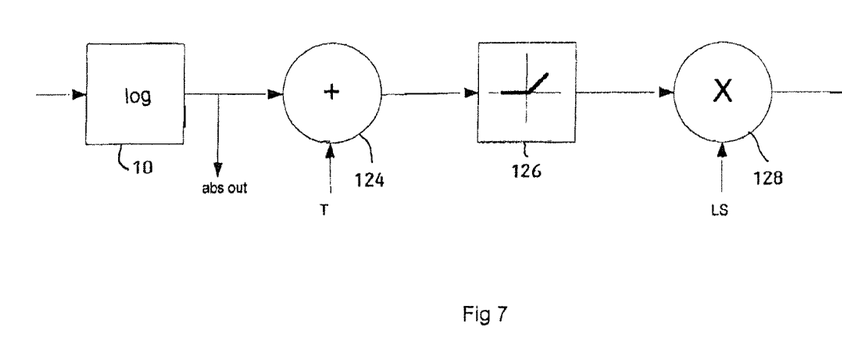
FIG. 7 shows a basic configuration of a Gain Control block of the dynamic range controller of FIG. 6.

As before, the abs value of the audio input signal is first found (not shown in FIG. 6). The abs of the input signal is then converted to the log domain in block 10, then passed to the Gain Control block 12, one configuration of which is shown schematically in FIG. 7. Referring to FIG. 7, the Gain Control block 12 is implemented as mentioned above with respect to FIG. 4, with adder 124, non-linear element 126, and multiplier 128 corresponding to the components 304, 306, and 308 respectively in FIG. 4. In this instance, however, the input to the Gain Control block 12 is the (log-converted) audio signal as already mentioned, and its output is fed to the Attack/Decay block 14. The abs output of the log block 10 in FIG. 7 is also passed to the Anti-clip circuit 18. This abs output, when added to the Gain output from the Attack/Decay block 14, provides the estimate of what the instantaneous signal-level would be if the gain was applied immediately. This is the Output Signal Estimate shown in the curves in FIG. 5. Using this Estimate signal, the Anti-clip control 18 determines the attack coefficient needed to reduce the gain in order to prevent clipping, which is supplied to the Attack/Decay block 14 in FIG. 6. This block in turn determines the gain value which, after antilog conversion at block 22, is applied to the original input signal delayed in delay element 20.

Figure 8:
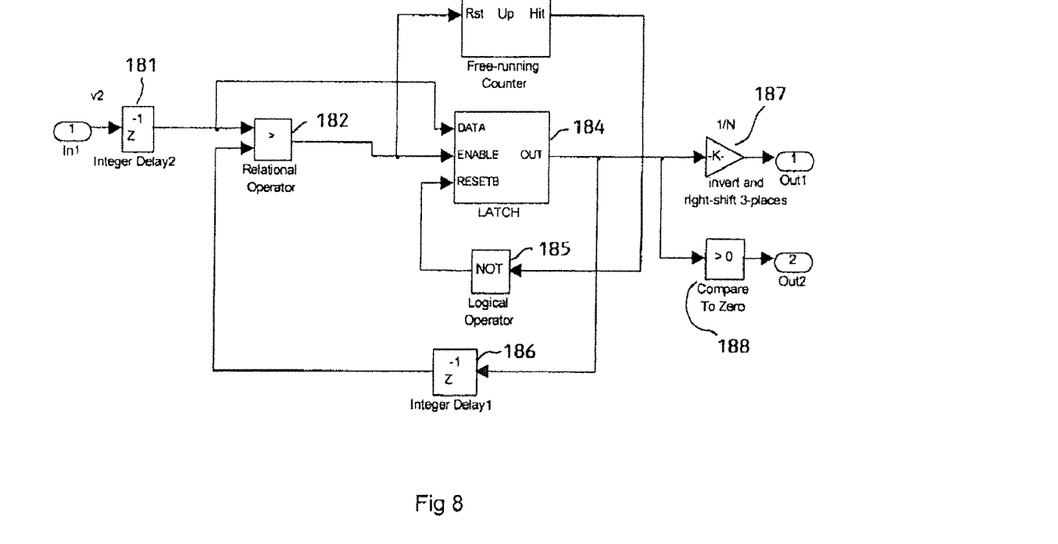
FIG. 8 shows one possible arrangement of an Anti-clip circuit in the dynamic range controller of FIG. 6.

A preferred implementation of the Anti-clip control 18 is shown in FIG. 8.

The input signal v2 to the Anti-clip control circuit is the sum of log block 10 and "Gain" from Attack/Decay 14 (see FIG. 6). In other words, this is the amplitude of the signal (in log domain) above the clip level, which is normalised in the system to 0 dB. The signal is first delayed in a delay element 181 to avoid a delay-free loop in the system. The signal is then compared, in comparator 182, to the output of a delay 186 which is initially zero (the clip level). If the signal is above zero, the delayed input signal v2 is latched in latch 184. The output of the latch is divided by –N at 187 (recall that N is the number of samples stored in delay 20 to provide the time delay T), and output as Out1 to the Attack/Decay block 14 in FIG. 6. This Out1 is the "Attack_coeff" shown in FIG. 6.

The Attack/Decay block 14 will reduce the gain by d/N for every sample. Meanwhile, the output of latch 184 is compared with zero in block 188 to yield an output Out2. This corresponds to the "Is_clipping" input of the Attack/Decay block as mentioned below.

When v2 is latched, a free-running counter 183 is also reset. Every sample, the counter 183 increments, until it reaches the "hit" value, which is equal to N, thus triggering NOT gate 185 to reset the latch 184. Thus, after N samples, the latch is reset and so the signal output to the Attack/Decay block 14 is zero.

If, during this cycle, the input signal increases further, there is the possibility that the signal will still clip after N cycles because the gain will not be reduced sufficiently. This condition is detected by continuously comparing, in comparator 182, the input signal to the previous latched signal via delay 186. If the input signal from delay 181 rises above the previous latched signal, the enable input of latch 184 is triggered and the whole cycle is repeated.

For implementation efficiency, the value of N is preferably chosen to be a power-of-two value. This means that the –1/N multiply 187 can be replaced by an inverter and shifter, which is physically smaller to implement in hardware than a multiply.

Figure 9:
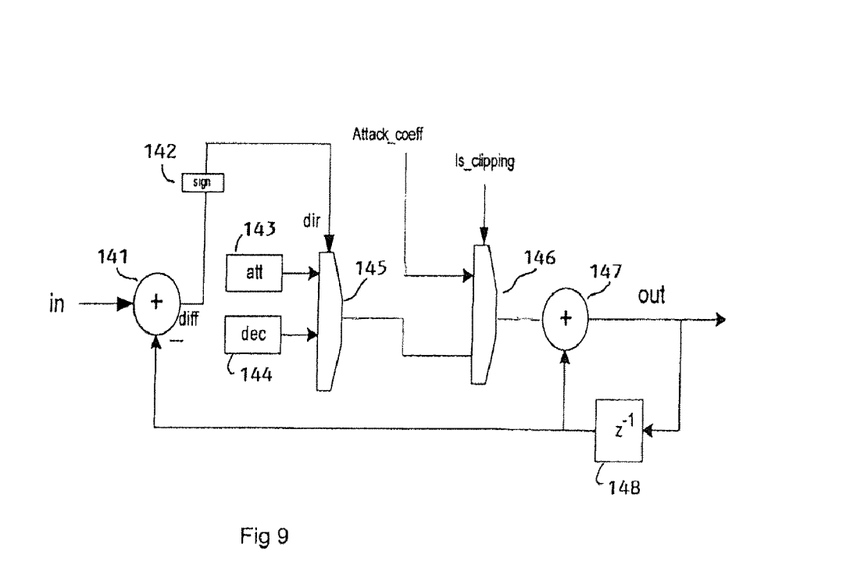
FIG. 9 shows one possible arrangement of an Attack/Decay block in the dynamic range controller of FIG. 6.

The logic configuration of the Attack/Decay block 14 of FIG. 6 is shown in FIG. 9. As will be seen by comparison with FIG. 2, the configuration of this block is modified over that used conventionally. In particular, in addition to a multiplexor 145 which selects the attack and decay coefficients 143, 144 as employed before, there is an additional multiplexor 146 responsive to the control signals (Attack_coeff and Is_clipping) from the Anti-clip control 18.

Because the signals are in the log-domain, the Attack/Decay block only needs to implement a constant rate of attack or decay, regardless of the input signal level. In the configuration according to this embodiment (see FIG. 6), the Attack/Decay receives, at its input, the output of the Gain Control block. The difference between this input signal In and the current value of the output Out is first determined in an adder 141 (signal 'Diff'). If the Diff signal is positive, the gain needs to reduce, therefore the attack coefficient Att is chosen (this is a negative value). If Diff is positive, the decay coefficient Dec is chosen (this is a positive value). If the output from the anti-clip control block 18 indicates that clipping is occurring, the Is_clipping flag will be set (see FIG. 6). This instructs the Attack/Decay block to select the Attack_coeff provided by the anti-clip circuit (a negative value due to the inversion on the output of the anti-clip control block 18). This causes the gain to reduce dynamically at a rate according to the signal level above the clip threshold.

In a similar way to FIG. 2, the output is integrated via adder 147 and delay element 148 to provide the final gain value, which after antilog processing is applied to the delayed audio signal (see FIG. 6). The result is an output audio signal of an amplitude at or below the clipping threshold and suitable for downstream use e.g. for D/A conversion followed by analogue amplification and reproduction.

Various modifications will occur to those skilled in the art within the scope of the present invention. For example, in the embodiment described above, the blocks are re-ordered in comparison with the prior art architecture such that the Attack/Decay block follows the Gain Control block, the Anti-clip control according to the present invention controlling the Attack/Decay block directly. However, this is not essential and the principle of the present invention may still be applied where the Attack/Decay block precedes the Gain Control block, as in FIG. 1. Indeed, since all of the "Attack/Decay block", "Gain Control block" and "Anti-clip control" ultimately have an effect on the gain applied to an input signal, these terms should be construed as convenient labels rather than necessarily mutually-exclusive functions.

As another example, part of the function of the logic circuits shown in the Figures may be replaced by one or more look-up tables (LUT). For example, a peak or average level of the input signal (the average normally being found as an estimate of the RMS of the signal level) can be applied as an index to a table of gain values.

Note that other variations on this circuit are possible, employing well known techniques. For example, the limiter Gain control implementation can be replaced by a more generic block which performs limiting, compression, expansion etc. Techniques described in [1] such as the implementation of a smoothing filter after the anti-log calculation can also be utilised.

To summarise, the present invention provides a dynamic range controller suitable for use as an Automatic Level Control (ALC) or Limiter whilst preventing clipping, where the amplitude of the signal above the clipping point is estimated, then the signal level is automatically reduced over a defined period equal to the feed-forward delay in the ALC/Limiter. By adaptively controlling, based on the excess amplitude and the delay time available, an attack rate used in the ALC/Limiter to reduce the gain applied to an input signal, it can be ensured that the output amplitude is brought within the clipping level (or close enough thereto) sufficiently quickly to prevent audible clipping.

Although the invention has been described in relation to a single audio signal or channel, it can of course be applied to multiple channels, such as left and right channels of headphones or surround sound type systems. Furthermore, where the invention is applied to a plurality of audio signals or channels, some elements may provide common functions to those plurality of signals/channels. For example, the anti-clip control may apply a common control signal to respective Attack/Decay blocks of each channel.

The above described embodiment illustrates rather than limits the invention, and those skilled in the art will be able to design many alternative embodiments without departing from the scope of the appended claims and their equivalents. As an example, as stated in the above description the gain must be attenuated by d dB in time T in order to prevent clipping (refer again to FIG. 5), but complete avoidance of clipping may not be required in every application. The present invention can be beneficially applied even in cases where a very short period of clipping is permitted to occur, since this may be inaudible in many applications. Thus, the "maximum permitted signal level", referred to in the claims, need not always be a clipping level. It could be a level slightly higher than the clipping level which allows the anti-clip control block, within that very short period, to bring the output level to below the clipping level.

In any case, the primary purpose of the present invention may not always be to prevent audible clipping. Equally or possibly even more important may be avoidance of peaks in power consumption which might result from outputting to a wider system a signal at or above the clipping level. In battery-powered applications, such peaks are preferably avoided since they may cause a dip in a power supply voltage and prompt an entire system such as a mobile telephone to shut down, if the voltage is already reduced by battery depletion.

Although the above description only refers to an attack rate and decay rate in the attack/decay block of a dynamic range controller, it will be understood by those skilled in the art that more complex gain control shaping is possible including, for example, a hold time.

As another example of a modification possible within the scope of the present invention, the dynamic range controller of the invention may be applied to non-audio signals. For example, it may be required to perform dynamic range control of a video signal in order, for example, to limit a range in luminance component of such a signal.

For the avoidance of doubt, it should be noted that the word "comprising" does not exclude the presence of elements or steps other than those listed in a claim, "a" or "an" does not exclude a plurality, and a single element may fulfil the functions of several elements recited in the claims. It should also be noted that the attenuation, or decrease, of a signal amplitude is a form of amplification, thus the word "amplify", "amplifying", "amplified" and the like can be taken to mean an increase or a decrease in the amplitude of a signal. Similarly any reference to "gain" applied may refer to a gain less than unity being applied (that is the effect of applying "gain" to a signal may result in its attenuation). Any reference to "addition", "add" or "adding" may equally mean subtraction.

Audio applications of the present invention include portable devices (MP3 players; mobile phones; PDAs and satellite navigation devices); Hi-Fi equipment including disk-based players such as DVD/CD; televisions; and digital cameras (Still & Video). In addition, the present invention may find application in fixed or semi-fixed installations such as in-car entertainment, aircraft on-board entertainment systems and so forth.

Embodiments of the present invention may be implemented in hardware, or as software modules running on one or more processors, or on a combination thereof. That is, those skilled in the art will appreciate that a programmable logic circuit, microprocessor or digital signal processor (DSP) may be used in practice to implement some or all of the functionality of the dynamic range controller described above. In particular, although the above description refers to an "Anti-clip circuit", it will be apparent to the skilled person that discrete hardware is not need to provide the anti-clip function of the invention in a dynamic range controller. Likewise, terms such as "block", "element" and "circuit" do not necessarily imply the use of hardware to provide the functions which have been described.

The invention may also be embodied as one or more device or apparatus programs (e.g. computer programs and computer program products) for carrying out part or all of the methods described herein. Such programs embodying the present invention may be stored on computer-readable media, or could, for example, be in the form of one or more signals. Such signals may be data signals downloadable from an Internet website, or provided on a carrier signal, or in any other form.

What is claimed is:

1. A dynamic range controller for converting a varying input signal to an output signal with a controlled dynamic range, comprising:
   a gain setting block arranged to receive the input signal and to set a gain value to be applied to the input signal in converting it to said output signal, the input signal being a digital audio signal comprising a series of samples;
   a delay block arranged to delay the input signal by a predetermined time T prior to applying said gain value, the delay block providing temporary storage of N said samples of said digital audio signal; and
   an anti-clip control block arranged to provide a control signal to the gain setting block based on a level of the input signal such that an attack rate, with which said gain value is reduced, is adaptively controlled to decrease the level of said output signal to at most a maximum permitted signal level within the time T, said maximum permitted signal level being a clipping level of the input signal, and said control signal being indicative of a value d/N where d is an amount by which the clipping level is predicted to be exceeded.

2. The dynamic range controller according to claim 1 wherein the anti-clip control block is arranged to receive an estimate of the level of the output signal which would be obtained by applying, to the current level of the input signal, the gain value presently set in the gain setting block.

3. The dynamic range controller according to claim 2 wherein the gain setting block comprises:
   a gain control block arranged to receive the input signal and to generate a gain setting value; and
   an attack/decay block arranged to apply said attack rate or a decay rate as a rate of change to the gain setting value from the gain control block in order to determine said gain value to be applied to the input signal, and responsive to the control signal from the anti-clip control block to vary said attack rate.

4. The dynamic range controller according to claim 3 wherein the gain control block is arranged to find and output the absolute value of the varying input signal.

5. The dynamic range controller according to claim 4 further comprising an adder arranged to receive said absolute value and the gain value set by the attack/decay block, the output of which provides said estimate of the level of the output signal to the anti-clip control block.

6. The dynamic range controller according to claim 5 wherein the anti-clip control block further comprises a latch arranged to store said estimate when this exceeds the maximum permitted signal level, and a divider for dividing the stored value by a quantity corresponding to the predetermined time T to provide said attack rate as said control signal to the gain setting block.

7. The dynamic range controller according to claim 1 wherein the anti-clip control block provides said control signal based on an amount by which the clipping level is predicted to be exceeded based on a present level of the input signal and the gain value presently set.

8. The dynamic range controller according to claim 1, wherein the input signal is in the log domain, the attack rate linearly reducing the level of the input signal over the time T to within the maximum permitted level.

9. The dynamic range controller according to claim 1 wherein the anti-clip control block is arranged to provide a first said control signal indicative of said attack rate and a second control signal instructing the gain setting block to apply said attack rate to reduce the gain value.

10. The dynamic range controller according to claim 1 wherein the gain setting block is further arranged to detect an average or peak level of the input signal, and the gain setting block applies the average or peak level as an index to a look-up table of gain values.

11. An audio apparatus including the dynamic range controller of claim 1.

12. The audio apparatus according to claim 11 in portable form, powered by a battery, the dynamic range controller serving to reduce a peak current drain on the battery.

13. A mobile telephone including the audio apparatus of claim 12.

* * * * *